United States Patent
Den Boef et al.

(10) Patent No.: US 11,022,902 B2
(45) Date of Patent: Jun. 1, 2021

(54) SENSOR, LITHOGRAPHIC APPARATUS, AND DEVICE MANUFACTURING METHOD

(71) Applicant: ASML Netherlands B.V., Veldhoven (NL)

(72) Inventors: Arie Jeffrey Den Boef, Waalre (NL); Patricius Aloysius Jacobus Tinnemans, Hapert (NL); Haico Victor Kok, Veldhoven (NL); William Peter Van Drent, Best (NL); Sebastianus Adrianus Goorden, Eindhoven (NL)

(73) Assignee: ASML Netherlands B.V, Veldhoven (NL)

( * ) Notice: Subject to any disclaimer, the term of this patent is extended or adjusted under 35 U.S.C. 154(b) by 0 days.

(21) Appl. No.: 16/623,647

(22) PCT Filed: May 14, 2018

(86) PCT No.: PCT/EP2018/062387
§ 371 (c)(1),
(2) Date: Dec. 17, 2019

(87) PCT Pub. No.: WO2018/233929
PCT Pub. Date: Dec. 27, 2018

(65) Prior Publication Data
US 2021/0072647 A1     Mar. 11, 2021

(30) Foreign Application Priority Data
Jun. 19, 2017 (EP) ........................... 17176549

(51) Int. Cl.
*G03B 27/72*     (2006.01)
*G03F 7/20*     (2006.01)

(52) U.S. Cl.
CPC ........ *G03F 7/7085* (2013.01); *G03F 7/70308* (2013.01); *G03F 7/70566* (2013.01); *G03F 7/70633* (2013.01)

(58) Field of Classification Search
CPC ............... G03F 7/7085; G03F 7/70308; G03F 7/70566; G03F 7/70633
See application file for complete search history.

(56) References Cited

U.S. PATENT DOCUMENTS

| | | | | |
|---|---|---|---|---|
| 5,661,560 A | * | 8/1997 | Ozaki | ................. G01N 21/956 250/225 |
| 2011/0032500 A1 | | 2/2011 | Straaijer | |
| 2013/0162996 A1 | | 6/2013 | Straaijer et al. | |

FOREIGN PATENT DOCUMENTS

WO    WO 2016/096310 A1    6/2016

OTHER PUBLICATIONS

International Search Report and Written Opinion of the International Searching Authority directed to related International Patent Application No. PCT/EP2018/062387, dated Aug. 22, 2018; 9 pages.

(Continued)

*Primary Examiner* — Peter B Kim
(74) *Attorney, Agent, or Firm* — Sterne, Kessler, Goldstein & Fox P.L.L.C.

(57) ABSTRACT

The invention relates to a sensor comprising: a radiation source to emit radiation having a coherence length towards a sensor target; and a polarizing beam splitter to split radiation diffracted by the sensor target into radiation with a first polarization state and radiation with a second polarization state, wherein the first polarization state is orthogonal to the second polarization state, and wherein the sensor is configured such that after passing the polarizing beam splitter radiation with the first polarization state has an (Continued)

optical path difference relative to radiation with the second polarization state that is larger than the coherence length.

14 Claims, 4 Drawing Sheets

(56) References Cited

OTHER PUBLICATIONS

International Preliminary Report on Patentability directed to related International Patent Application No. PCT/EP2018/062387, dated Dec. 24, 2019; 6 pages.

\* cited by examiner

SENSOR, LITHOGRAPHIC APPARATUS, AND DEVICE MANUFACTURING METHOD

CROSS-REFERENCE TO RELATED APPLICATIONS

This application claims priority of EP application 17176549.8, which was filed on 19 Jun. 2017 and which is incorporated herein in its entirety by reference.

BACKGROUND

Field of the Invention

The present invention relates to a sensor, a metrology apparatus, a lithographic apparatus comprising such a sensor and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, many sensors are provided, e.g. for alignment and/or overlay metrology. The trend is to use segmented sensor targets, e.g. gratings, with a strong polarization dependent response. In order to provide a more robust and accurate sensor, it has been proposed to detect the position of the grating for two orthogonal polarization states of the light that is diffracted by the gratings.

In such a sensor the light that is diffracted by the gratings may be split in light with a first polarization state and light with a second polarization state orthogonal to the first polarization state using a polarizing beam splitter. Ideally the split is perfect, but in practice after passing the polarizing beam splitter, the light with the first polarization state is still accompanied by a fraction of light with the second polarization state and vice versa. Hence, the light signals contain an error that scales with the amplitude ratio between light with the 'wrong' polarization state and light with the 'desired' polarization state. Moreover, the error depends on the phase difference between the two polarized beams. Diffraction strength and phase differences in turn strongly depend on the segmentation of the grating and the wavelength of the light. This relation, however, is not simple and predictable, which leads to an apparently unpredictable error due to the polarization crosstalk.

SUMMARY

It is desirable to provide a sensor with a reduced error due to polarization crosstalk.

According to an embodiment of the invention, there is provided a sensor comprising:
 a radiation source to emit radiation having a coherence length towards a sensor target; and
 a polarizing beam splitter to split radiation diffracted by the sensor target into radiation with a first polarization state and radiation with a second polarization state, wherein the first polarization state is orthogonal to the second polarization state, and wherein the sensor is configured such that, after passing the polarizing beam splitter, radiation with the first polarization state has an optical path difference relative to radiation with the second polarization state that is larger than the coherence length.

According to another embodiment of the invention, there is provided a lithographic apparatus comprising a sensor according to the invention.

According to another embodiment of the invention, there is provided a metrology apparatus comprising a sensor according to the invention.

According to a further embodiment of the invention, there is provided a device manufacturing method wherein use is made of a sensor and/or a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
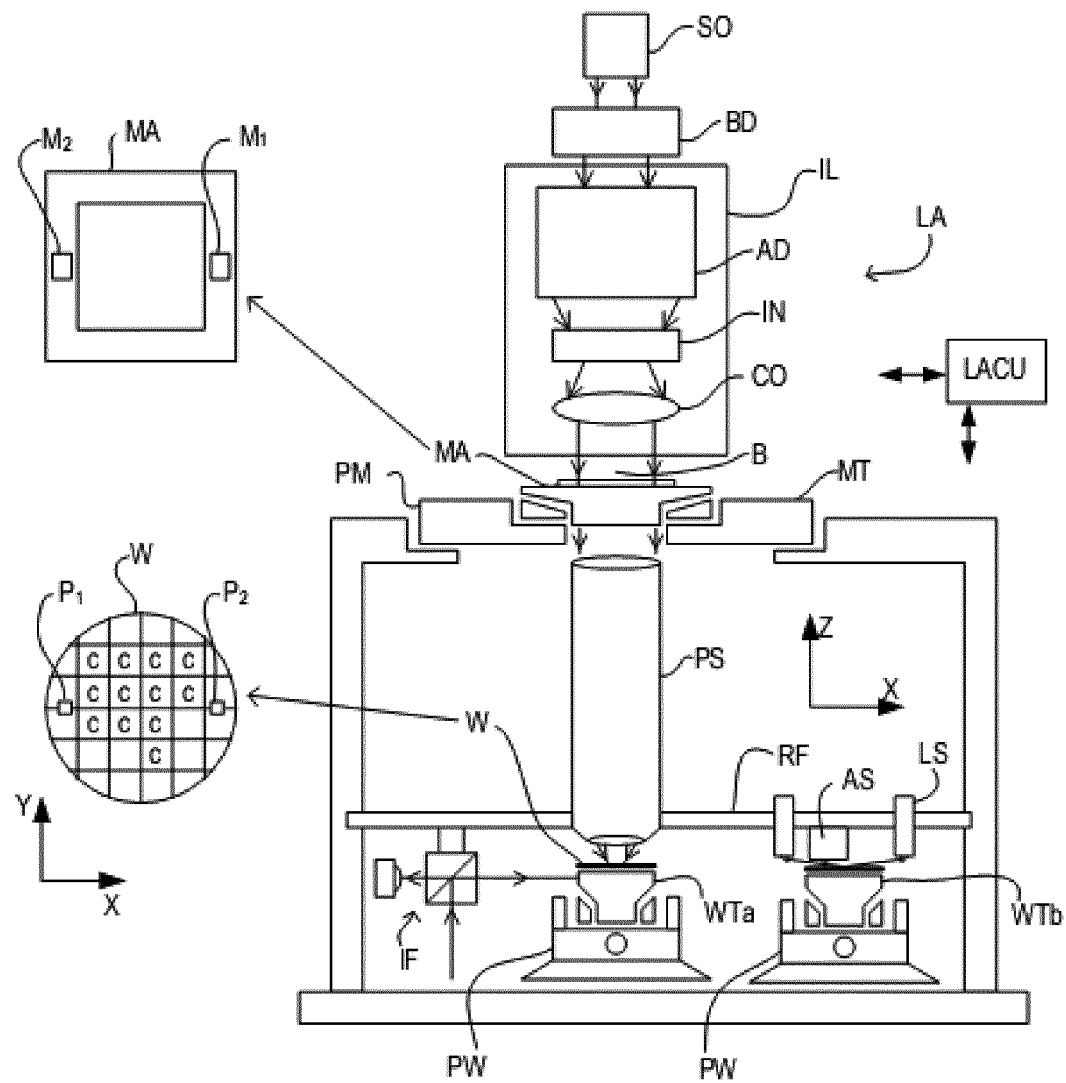
FIG. 1 depicts a lithographic apparatus according to an embodiment of the invention.

FIG. 1 schematically depicts a lithographic apparatus according to one embodiment of the invention. The apparatus comprises:
 an illumination system (illuminator) IL configured to condition a radiation beam B (e.g. UV radiation or EUV radiation).
 a support structure (e.g. a mask table) MT constructed to support a patterning device (e.g. a mask) MA and connected to a first positioner PM configured to accurately position the patterning device in accordance with certain parameters;
 a substrate table (e.g. a wafer table) WTa or WTb constructed to hold a substrate (e.g. a resist-coated wafer) W and connected to a second positioner PW configured to accurately position the substrate in accordance with certain parameters; and
 a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
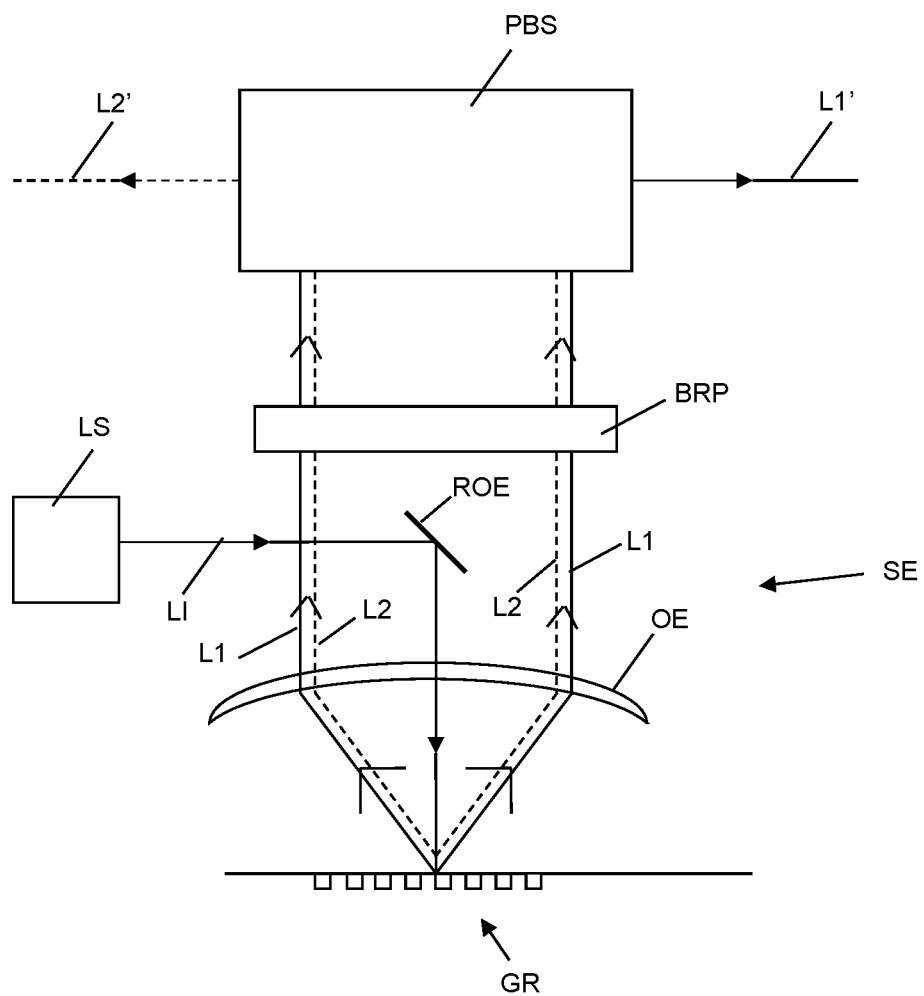
FIG. 2 schematically depicts a sensor according to an embodiment of the invention.

FIG. 2 schematically depicts a sensor SE according to an embodiment of the invention, which sensor may be part of the lithographic apparatus of FIG. 1 or a metrology apparatus, for example arranged to measure overlay characteristics, and which is able to interact with a grating GR or mark as described above to determine the position of the grating or mark. Although the description below refers to gratings as sensor target in particular, it is specifically noted here that the invention also applies to non-grating features as sensor target.

The sensor SE comprises a radiation source LS configured to emit radiation LI having a coherence length towards a grating GR, for example an alignment mark. The coherence length may for instance be in the range of 10 μm-1 mm. Coherence length is the propagation direction over which a coherent wave maintains a specified degree of coherence. The invention makes use of the property that wave interference is relatively strong when the optical paths taken by all of the interfering waves differ by less than the coherence length and relatively weak when the optical paths taken by at least some of the interfering waves differ by more than the coherence length.

In this embodiment, use is made of a reflective optical element ROE directing the radiation LI from the radiation source LS towards the grating GR. It will be apparent to the skilled person that additional or alternative optical elements may be used to manipulate the radiation LI in order to obtain radiation LI with the proper optical properties to be incident to the grating GR. The radiation source LS and these optical elements, where appropriate, may be considered to be part of a lighting system configured to provide radiation LI with desired properties to the grating GR for diffraction or scattering purposes.

In the embodiment of FIG. 2, the radiation LI incident to the grating GR is circularly polarized. The grating GR is a segmented grating such that the radiation that is diffracted by the grating GR comprises radiation L1 with a first polarization state indicated in FIG. 2 by a solid line and radiation L2 with a second polarization state indicated in FIG. 2 by a broken line.

The diffracted radiation L1 and L2 subsequently pass an optical element OE configured to collect the diffracted radiation L1 and L2, and a birefringent retarder BRP. The birefringent retarder BRP, which in this example has the shape of a plate but any other suitable shape may be applied. The birefringent retarder BRP comprising suitable birefringent material such as, for example, calcite, has a refractive index which is dependent on the polarization state and has a thickness which results in an optical path difference between radiation L1 with the first polarization state and radiation L2 with the second polarization state that is larger than the coherence length.

As an example, when the refractive index difference between the two polarization states is for instance 0.1 and the coherence length of the radiation LI is 100 μm, the thickness of the birefringent retarder plate is preferably at least 100 μm/0.1=1 mm to allow the two polarization states accumulate an optical path length difference larger than the coherence length.

The radiation L1 and L2 subsequently passes a polarizing beam splitter PBS configured to split the radiation diffracted by the grating GR into radiation L1' with mainly the first polarization state and radiation L2' with mainly the second polarization state. In an ideal world, the splitting of the polarizing beam splitter is perfect and radiation L1' is equal to radiation L1 and radiation L2' is equal to radiation L2. However, besides radiation L1, radiation L1' also comprises a small fraction of radiation L2 with the second polarization state and besides radiation L2, radiation L2' also comprises a small fraction of radiation L1 with the first polarization state.

As a result of the birefringent retarder plate BRP, the radiation L1 and radiation L2 are incoherent and thus the phase difference between the two radiations does not play such a significant role anymore and the error becomes a function of the ratio between the intensities of the radiation L1 and the radiation L2 instead of the amplitude, thereby resulting in a more accurate position measurement when the radiation L1 ' and radiation L2' are used in interferometry, e.g. a self-referencing interferometer.

Figure 3:
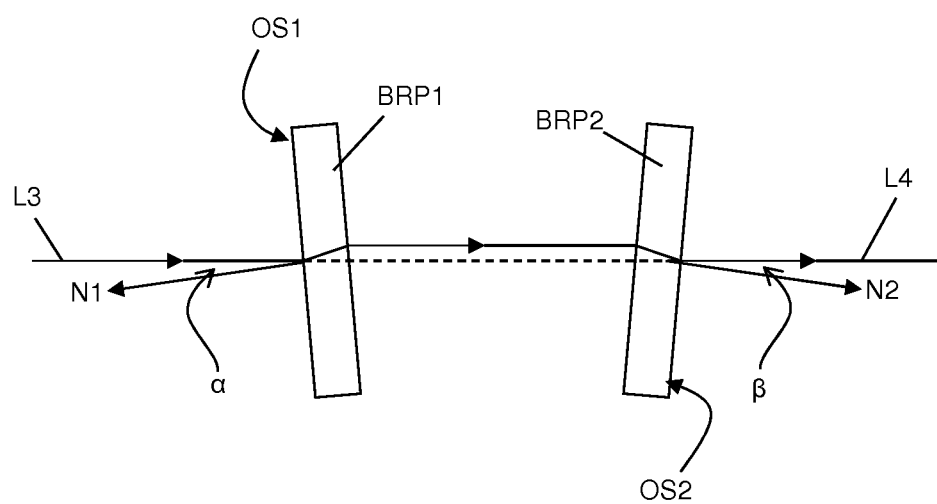
FIG. 3 schematically depicts an embodiment of a birefringent retarder which may be applied in a sensor according to an embodiment of the invention.

FIG. 3 depicts an alternative embodiment of the sensor of FIG. 2. The difference between the two embodiments is that in the embodiment of FIG. 3 the single birefringent retarder BRP has been replaced by a first birefringent retarder BRP1 and a second birefringent retarder BRP2, both of which have in this example the shape of a plate, but any other suitable shape may be applied. The first and second birefringent retarder plates BRP1, BRP2 are tilted so that a normal N1 to an optical surface OS1 of the first birefringent retarder plate BRP1 makes a non-zero angle α with a propagation direction of the radiation L3 incident to said optical surface OS1, and a normal N2 to an optical surface OS2 of the second birefringent retarder plate BRP2 makes a non-zero angle β with a propagation direction of the radiation L4 leaving the optical surface OS2. The angles α, β and the thicknesses of the first and second birefringent retarder plate BRP1, BRP2 have been chosen such that the radiation L4 having passed both the first and second birefringent retarder plates propagates in substantially the same direction as radiation L3 prior to passing both the first and second birefringent retarder plates, i.e. radiation L3 and radiation L4 are aligned, or in other words the beam shift is zero as indicated by the dashed line. The angles α and β are non-zero to avoid back-reflections from the optical surfaces. The beam shift is preferably zero after passing the two birefringent retarder plates to avoid wavelength-dependent beam shifts. The angles α and β are preferably in the order of mradians.

Preferably, a temperature sensitivity of a refractive index of the first birefringent retarder plate BRP1 is opposite to a temperature sensitivity of a refractive index of the second birefringent retarder plate BRP2. In that case, the sensitivity of the sensor to temperature is reduced. More preferably, a product of the temperature sensitivity of the refractive index of the first birefringent retarder plate BRP1 and a thickness of the first birefringent retarder plate BRP1 is substantially equal to a product of the temperature sensitivity of the refractive index of the second birefringent retarder plate BRP2 and a thickness of the second birefringent retarder plate BRP2.

In another embodiment, the radiation LI incident to the grating GR comprises linear polarized radiation (e.g. X or Y polarized). The grating GR in this embodiment is a grating which is configured to change the polarization of incoming radiation, for example from X to Y or vice versa (180 degrees) such that the radiation that is diffracted by the grating GR comprises radiation with a different polarization state than the incoming radiation (which is the radiation emitted by the radiation source). In other words, the grating changes the incoming radiation having a first polarization state to diffracted radiation having a second polarization state which is different from the first polarization state. In case the grating is buried beneath one or more semiconductor or other material layers, the incoming radiation will also reflect and/or scatter from a top surface (or another surface) of the one or more of layers, for example from a residual surface topography originating from the grating beneath. The polarization state of the radiation scattered and/or reflected from the top surface (or other surfaces of the layer stack on top of the grating) will not change significantly, and will keep its original first polarization state which is different from the second polarization state of the radiation diffracted from the grating GR. The one or more birefringence retarders are in this case arranged to provide an optical path difference between radiation diffracted from the grating GR with the second polarization state and radiation scattered and/or reflected not from the grating GR with the first polarization state that is larger than the coherence length. This leads to an incoherent instead of a coherent addition of the radiation diffracted from the grating GR and radiation scattered and/or reflected not from the grating (e.g. from a top surface) which reduces an error in a determination of a characteristic of the grating, such as a position of the grating (because the phase difference between the two radiations does not play such a significant role anymore and the error becomes a function of the ratio between the intensities of the radiation diffracted from the grating and the radiation scattered from another surface instead of the amplitude).

In an embodiment one or more birefringent retarders are arranged such that the optical path difference between radiation with the first polarization state and radiation with the second polarization state is larger than the coherence length after diffraction from the grating. In this case the one or more birefringent retarders are positioned e.g. between the grating GR and the optical element OE.

Although the shown embodiments disclose a single birefringent retarder (FIG. 2) or two birefringent retarders (FIG. 3), the invention is not limited to these embodiments and may comprise more birefringent retarders, i.e. the optical path difference may be mainly caused by one or more birefringent retarders.

In an embodiment at least one layer provided on top of the grating is opaque to radiation in the visible wavelength range. In this case the radiation source may be arranged to emit infrared radiation, e.g. in a wavelength range up to 1000 nm, 1500 nm or 2000 nm. In an embodiment the radiation source is a broadband radiation source arranged to emit radiation in a broad wavelength range, for example from UV to infrared.

Although the shown embodiments disclose and describe the position of the one or more birefringent retarders to be solely in between the grating GR and the polarizing beam splitter PBS, the one or more birefringent retarders may well be located in additional or alternative positions.

Figure 4:
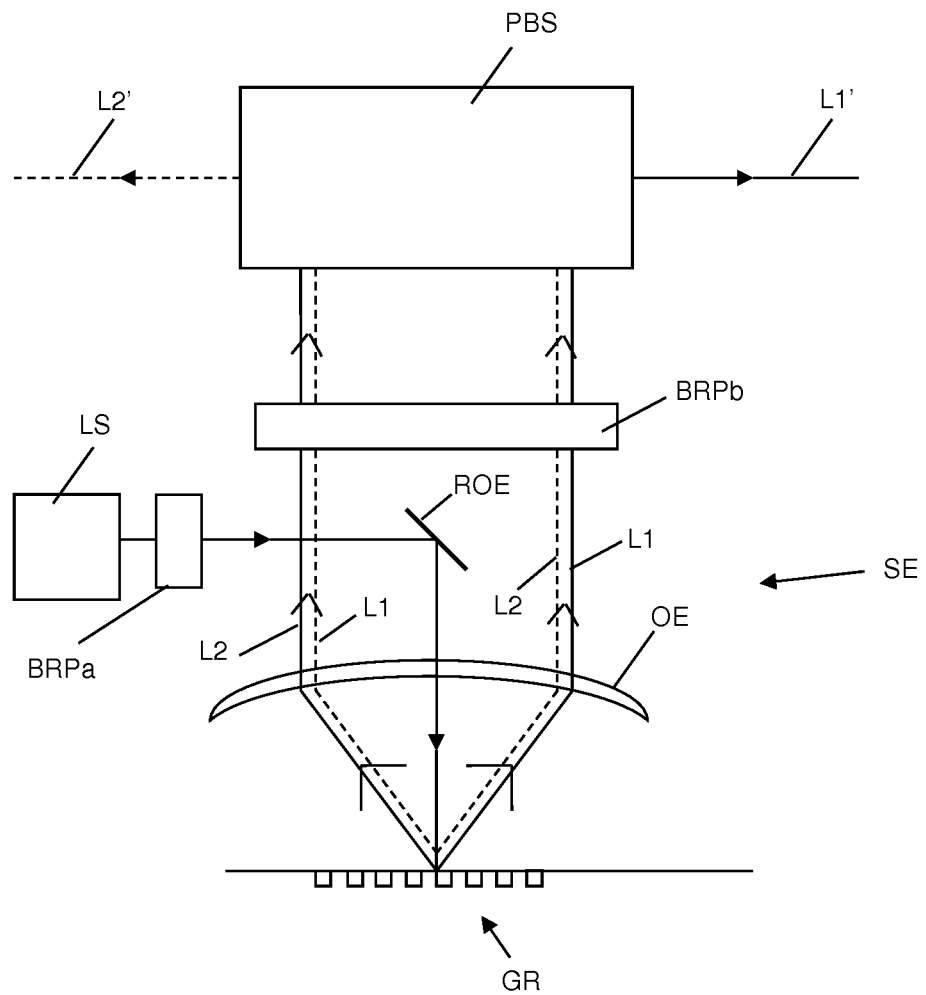
FIG. 4 schematically depicts a sensor according to an embodiment of the invention.

In an embodiment the one or more birefringent retarders are arranged such that the optical path difference between radiation with a first polarization state and radiation with a second polarization state (different from the first polarization state) is larger than the coherence length before interaction of the radiation with the grating. In this case the one or more birefringent retarders may be positioned between the radiation source and the grating, for example between the radiation source and the reflective optical element ROE. The radiation source provides in this example circularly polarized radiation and the one or more birefringent retarders are positioned downstream from the radiation source and before interaction of the radiation with the grating. The one or more birefringent retarders are configured such that the optical path difference between linear X- and Y-polarization components of the circularly polarized radiation is larger than the coherence length before interaction with the one or more birefringent retarder plates. For example a birefringent retarder plate is then positioned between the radiation source and the optical element ROE. FIG. 4 shows a further embodiment of a sensor comprising a birefringent retarder and a further birefringent retarder. More specifically, the sensor in this embodiment comprises an illumination path birefringent retarder plate BRPa positioned between the radiation source LS and the reflective optical element ROE (i.e. the illumination path of the sensor) and a detection path birefringent retarder plate BRPb positioned between the between the optical element OE and the polarizing beam splitter PBS (i.e. the detection path of the sensor). The detection path birefringent retarder plate BRPb at least partly compensates for any influence of the optical element OE (or other optical elements positioned in between the grating and the retarder) on the retardance of the polarization states. Although the birefringent retarders in this embodiment have the shape of a plate, other suitable shapes may be applied instead. In an embodiment the thickness of the illumination path birefringent retarder plate BRPa is different from the thickness of the detection path birefringent retarder plate BRPb to provide for a sufficient separation in time and space of pulses of radiation in case of a pulsed radiation source. Note that one or each of the illumination path and the detection path birefringent retarder plates may comprise the first and second birefringent retarder plates as shown in FIG. 3.

Although the shown embodiments mainly employ birefringence to let the two polarization states accumulate an optical path difference larger than the coherence length, the invention may also use for instance a polarizing beam splitter to geometrically add optical path length to radiation having a particular polarization state and recombining the radiation again with a polarizing beam combiner. An advantage of the one or more birefringent retarder plates is that this may be an easier solution which additionally or alternatively may require less space.

Although not much information has been given on how the position of the grating is determined, it is explicitly mentioned here that the shown sensors may further comprise a first interferometer arranged downstream of the polarizing beam splitter PBS to measure a position of the grating GR using the radiation L1' with the first polarization state, and a second interferometer arranged downstream of the polarizing beam splitter PBS to measure a position of the grating GR using the radiation L2' with the second polarization state. The first and second interferometer preferably are self-referencing interferometers.

In an embodiment the sensor is configured to provide a different geometric optical path for radiation with the first polarization state then which is different from a geometrical path for radiation with the second polarization state.

Although the depicted embodiments show a grating GR, the invention also applies to sensor target having non-grating features. In such case, the phrase "diffracted by the sensor target/grating" may be also be read to include or be replaced by "scattered by the sensor target/non-grating features".

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A sensor comprising:
a radiation source configured to emit radiation having a coherence length towards a sensor target; and
a polarizing beam splitter configured to split radiation that has interacted with the sensor target into radiation with a first polarization state and radiation with a second polarization state,
wherein the first polarization state is orthogonal to the second polarization state,
and wherein the sensor is configured such that, after passing the polarizing beam splitter, radiation with the first polarization state has an optical path difference relative to radiation with the second polarization state that is larger than the coherence length.

2. The sensor of claim 1, wherein the sensor is configured such that, after interaction with the sensor target, radiation with the first polarization state has an optical path difference relative to radiation with the second polarization state that is larger than the coherence length.

3. The sensor of claim 1, comprising a birefringent retarder configured to provide for the optical path difference.

4. The sensor of claim 3, wherein the birefringent retarder is positioned between the radiation source and the sensor target.

5. The sensor of claim 4, wherein a further birefringent retarder is arranged between the sensor target and the polarizing beam splitter.

6. The sensor of claim 5, wherein a thickness of the birefringent retarder and a thickness of the further birefringent retarder is different.

7. The sensor of claim 3, wherein the birefringent retarder is positioned between the sensor target and the polarizing beam splitter.

8. The sensor of claim 3, wherein the birefringent retarder and/or further birefringent retarder comprises two or more birefringent retarders.

9. The sensor of claim 3, wherein the birefringent retarder comprises a first birefringent retarder and a second birefringent retarder configured to provide for the optical path difference, wherein a normal to an optical surface of the first birefringent retarder is non-parallel to the propagation direction of the radiation passing the first birefringent retarder, and wherein the second birefringent retarder is oriented such that radiation having passed both the first and second birefringent retarders propagates in substantially the same direction as radiation prior to passing both the first and second birefringent retarder.

10. The sensor of claim 9, wherein a temperature sensitivity of a refractive index of the first birefringent retarder is opposite to a temperature sensitivity of a refractive index of the second birefringent retarder.

11. The sensor of claim 1, wherein the radiation source is configured to emit circularly polarized radiation.

12. A metrology apparatus comprising a sensor, comprising:
a radiation source configured to emit radiation towards a sensor target, wherein the emitted radiation has a coherence length; and
a polarizing beam splitter configured to split radiation that has interacted with the sensor target into radiation with a first polarization state and radiation with a second polarization state,
wherein the first polarization state is orthogonal to the second polarization state,
and wherein the sensor is configured such that, after passing the polarizing beam splitter, radiation with the first polarization state has an optical path difference relative to radiation with the second polarization state that is larger than the coherence length.

13. A lithographic apparatus comprising a sensor, comprising:
a radiation source configured to emit radiation towards a sensor target, wherein the emitted radiation has a coherence length; and
a polarizing beam splitter configured to split radiation that has interacted with the sensor target into radiation with a first polarization state and radiation with a second polarization state,
wherein the first polarization state is orthogonal to the second polarization state,
and wherein the sensor is configured such that, after passing the polarizing beam splitter, radiation with the first polarization state has an optical path difference relative to radiation with the second polarization state that is larger than the coherence length.

14. A lithographic apparatus according to claim 13, further comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the sensor is configured to measure a position of a sensor target provided on the substrate table, the support, a patterning device supported by the support and/or a substrate held by the substrate table.

* * * * *